United States Patent [19]

Gruen et al.

[11] Patent Number: 5,176,950
[45] Date of Patent: Jan. 5, 1993

[54] METHOD OF BONDING METALS TO CERAMICS AND OTHER MATERIALS

[76] Inventors: Dieter M. Gruen, 1324 59th St., Downers Grove, Ill. 60516; Alan R. Krauss, 24461 W. Boulevard DeJohn, Plainfield, Ill. 60544; A. Bruce DeWald, 3931 Windhurst Dr., Lilburn, Ga. 30247; Chien-Ping Ju, 11 Pine View, Carbondale, Ill. 62901; James M. Rigsbee, 1008 Wilshire Ct., Champaign, Ill. 61821

[21] Appl. No.: 290,634

[22] Filed: Dec. 27, 1988

[51] Int. Cl.$^5$ .............................. B32B 9/00
[52] U.S. Cl. .................... 428/209; 428/210; 428/426; 428/432; 428/433; 428/457; 428/461; 428/688; 428/901; 505/1; 174/125.1
[58] Field of Search ............ 505/1, 701–704; 428/209, 210, 426, 432, 433, 457, 461, 688, 901, 930; 174/125.1

[56] References Cited

U.S. PATENT DOCUMENTS 4,341,572 7/1982 Jachikawa et al. .............. 148/133
4,757,161 7/1988 Wilhelm et al. ................. 29/599

Primary Examiner—Patrick J. Ryan
Attorney, Agent, or Firm—Reinhart, Boerner, Van Deuren, Norris & Rieselbach

[57] ABSTRACT

A composite and method of forming same wherein the composite has a non-metallic portion and an alloy portion wherein the alloy comprises an alkali metal and a metal which is an electrical conductor such as Cu, Ag, Al, Sn or Au and forms an alloy with the alkali metal. A cable of superconductors and composite is also disclosed.

12 Claims, 1 Drawing Sheet 5,176,950

METHOD OF BONDING METALS TO CERAMICS AND OTHER MATERIALS

This invention was made with Government support under Contract Number W-31-109-ENG-38 awarded by the United States Department of Energy. The Government has certain rights in the invention.

BACKGROUND OF THE INVENTION

This invention relates to a composite material consisting of a non-metallic portion and a metallic portion. With the discovery of ceramic superconducting material and particularly with the discovery of ceramic superconducting materials having $T_c$s higher than the temperature of liquid nitrogen, a flurry of activity has occurred in the scientific community relating to these ceramic materials as well as newly discovered materials and the potential uses for them. Even with elevated $T_c$s, at the present time the state of the superconductor art is such that superconducting materials must be cooled to a significant extent before the onset of superconducting properties, that is the point at which the electrical resistance becomes zero there is complete diamagnetism. Taking into account the requirement of significant cooling, there will be difficulties in adhering superconducting ceramics to metal substrates due to the differences in the coefficients of expansion of the variant materials as well as thermal shocks created during repetitive thermal cycling between superconducting temperatures and ambient or elevated temperatures.

Various superconductor systems have been investigated including the 1-2-3 system and the 2-2-1-2 system, these respectively being the $Y-Ba_2-Cu_3-O_x$ system and the $Bi_2-Sr_2-Ca-Cu_2-O_x$ systems. Both of these superconductors ceramics and the bonding of ceramics to metals has heretofore been difficult, if not impossible.

By accident it has been found that ceramics will bond to certain metal alloys and this serendipitous discovery is the basis for the invention.

Accordingly, it is a principal object of the invention to provide a composite material of a ceramic or glass portion and a metal portion.

Another object of the invention is to provide a method of bonding a metal to a non-metallic such as glass or ceramic.

Another object of the invention is to provide a composite comprising a non-metallic portion and an alloy portion wherein the alloy comprises an alkali metal and a metal which is an electrical conductor and forms an alloy with the alkali metal.

Still another object of the invention is to provide a composite of a non-metallic portion and an alloy portion diffusion bonded thereto, the alloy portion comprised of an alkali metal of Li, Na, K or mixtures thereof and an electrically conductive metal which forms an alloy with the alkali metal.

Another object of the invention is to provide a method of forming a composite of a non-metallic member and metal alloy covering at least a portion of the non-metallic member, comprising providing a non-metallic member having an exposed surface, bonding a metal alloy including one or more of an alkali metal and one or more of a metal selected from the group consisting of Cu, Ag, Al and Au to at least a portion of the exposed surface of the non-metallic member, and thereafter bonding a metal to the metal alloy.

Another object of the invention is to provide a method of forming a composite of a non-metallic portion and metal alloy covering at least a part of the non-metallic portion, comprising providing a non-metallic portion having an exposed surface, providing a metal alloy including one or more of an alkali metal and one or more of an electrically conductive metal which forms an alloy with the alkali metal bonded to at least a part of the non-metallic portion.

A final object of the invention is provide an electrical conductor comprising a plurality of ceramic superconductor members surrounded by an electrically conducting alloy binder containing an alkali metal enclosed by a heat-transfer casing.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE PREFERRED EMBODIMENT

Figure 1:
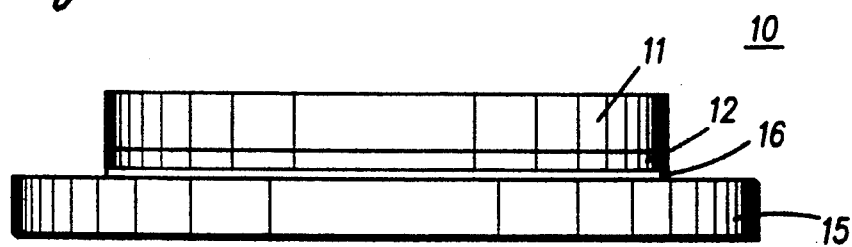
FIG. 1 shows a ceramic metal alloy composite brazed to a metal substrate.

Referring now to FIG. 1, there is disclosed a composite 10 having a non-metallic portion 11. Bonded to the non-metallic portion 11 is a metal alloy 12. The composite 10 consisting of the non-metallic portion 11 and the metal alloy 12 is connected to a metal substrate 15 by means of a brazed material 16 located intermediate the metal portion 12 and the metal substrate 15. The non-metallic portion 11 of the composite 10 may be glass, as hereinafter defined, or ceramic. Glass as used herein is any amorphous non-metal while ceramic as used herein is a non-metal with a well defined crystal structure.

The metal 12 may be a variety of alloys, each of which contains an alkali metal constituent and another constituent selected from a conducting metal which will form an alloy with the alkali metal. In each case, the metal alloy must be an electrical conductor. Representative alkali metals include lithium, sodium, potassium and cesium whereas the other metal constituent in the alloy may be without limitation, for instance, copper, silver, gold, aluminum or tin. The substrate 15 may be any metal to which the metal alloy portion 12 of the composite 10 can be bonded such as by brazing. The preferred metal substrate 15 if it composite-metal combination is to be an electrical conductor would be copper or copper bearing alloys.

Figure 2:
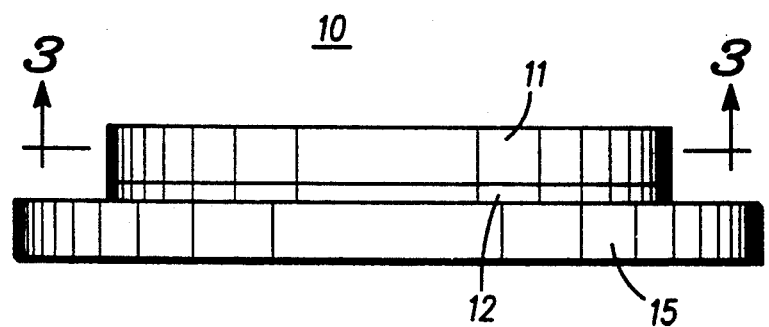
FIG. 2 shows a composite diffusion bonded to a metal substrate.

FIG. 2 shows the composite 10 hereinbefore described having the non-metallic portion 11 and the metallic portion 12 which is directly diffusion bonded onto the metal substrate 15. In the embodiment of FIG. 2, the brazed material 16 intermediate the composite 10 and the substrate 15 is eliminated. The end uses of the composite 10 of FIG. 1 with the brazed material 16 connecting the composite 10 to the substrate 15 may be the same as in the illustration in FIG. 2.

Figure 3:
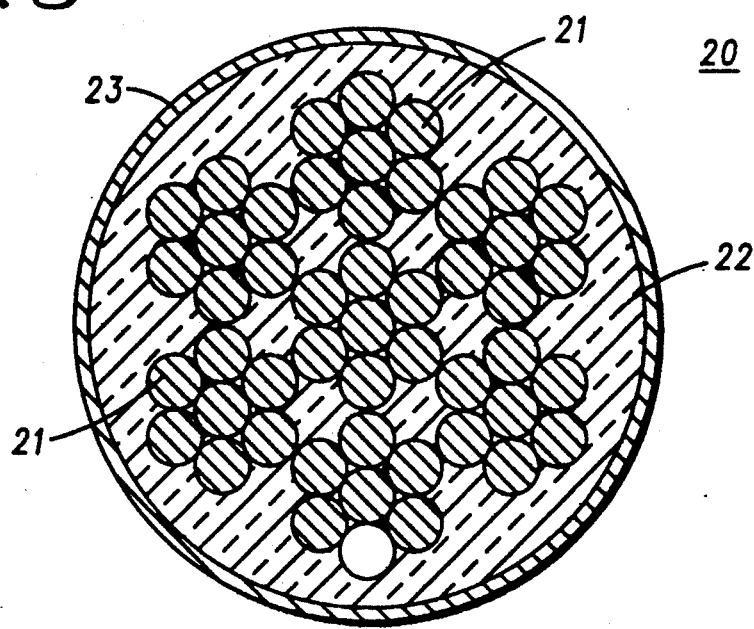
FIG. 3 is a cross-sectional view of a superconducting cable or wafer.

Referring to FIG. 3, there is disclosed a device which includes in one embodiment a cable 20 having a plurality of strands 21 of a superconductor material grouped in discrete clusters surrounded by a stabilizer binder alloy 22 which may be of the same material as the alloy 12 previously discussed, surrounded by a metal sheath 23 which may be a conductor such as copper. The metal alloy 22 serves both as a stabilizer to accommodate the thermal shock encountered during repetitive thermal occasioned by superconductors having $T_c$s of 95° K. to 105° K. or the like and also serves to bind the superconductor strands 21 to each other in electrical contact. The sheath 22 may be of copper, aluminum or various alloys thereof which serve to physically stabilize the cable 20. Where electrical connectors are needed, the device 20 in another embodiment can be a thin wafer of the same material described with respect to the cable embodiment.

As before stated, this entire invention was discovered serendipitously during an attempt to ballmill a lithium, copper alloy with balls of aluminum oxide ceramic. After the ballmilling, it was found, unexpectedly, that some of the lithium copper alloy had diffusion bonded onto the aluminum oxide ceramic balls. Using this unexpected discovery as a starting point, various other ceramics and glass have been bonded with a variety of alloys. The method by which the alloy is bonded to the ceramic or glass is not as important as the resulting bonded composite material. For instance, it has been found that physically squeezing a copper-lithium sheath onto a ceramic member has resulted in a diffusion bond. A diffusion bond can also be obtained when the lithium-copper is in the form of a metal powder or a metal foil.

In another aspect, the metal alloy may be sputtered onto the ceramic or glass non-metallic portion of the composite or vapor deposited by a variety of methods such as ion plating, evaporation or arc-cathodic deposition. There is is also a reasonable expectation that chemical vapor deposition will result in the same bonds as have been demonstrated by the aforesaid outlined methods.

As before stated, glass has, as used herein, a broader definition than the window pane glass principally made of silicon dioxide. Rather, glass in its broadest scientific meaning of an amorphous non-metallic material may include compounds as titanium, copper, etc.

Although lithium-copper alloys have principally been used, lithium-aluminum, gold-cesium, potassium or sodium-copper or aluminum are also alternative alloys. As is well known, thermodynamic computations will predict stable alloys with the alkali metals.

The cable 20 of the present invention has uses as an electrical conductor of a superconducting material and a wafer should function as a bond between the superconductor material and the source of the electricity. The device 20 in wafer or thin sheet form may also be useful as electrical contacts, switching devices and the like. The stabilizer 23 serves several purposes. In the first instance, it stabilizes the physical shape of the device 20, particularly if it is elongated such as a cable. Additionally, use of a material such as copper or copper alloy dissipates heat during operation to prevent the temperature from becoming too high and losing the superconducting properties. In addition, the use of copper or copper alloys will provide electrical contact to the electrical source. As before stated, the copper-lithium alloy 22 bonds the superconducting strands 21 to the copper or copper alloy sheath 23 so as to improve the electrical connection and to provide a metal matrix for the ceramic superconductor. This is important to ensure that the electrical bond between the superconductor 21 and the sheath 23 is maintained during thermal cycling.

As used herein, the term "alloy" means an alloy in the technical sense, an intermetallic or ionic compound which is capable of fusing with ceramic or glass, is stable and is electrically conducting. As before stated, copper-lithium, tin-lithium, gold-cesium and others are suitable compounds.

While there has been disclosed what is considered to be the preferred embodiment of the present invention, it is understood that various changes in the details may be made without departing from the spirit, or sacrificing any of the advantages of the present invention.

We claim:

1. A composite comprising a non-metallic portion of glass or ceramic and an alloy portion wherein the alloy comprises an alkali metal and a metal which is an electrical conductor and forms an electrically conductive alloy with the alkali metal.

2. The composite of claim 1, wherein the non-metallic portion is ceramic and the alloy includes Li.

3. The composite of claim 1, wherein the alkali metal is Li, Na, K or mixtures thereof.

4. The composite of claim 1, wherein the alkali metal is Li or Na and the other metal in the alloy portion is Cu, Ag, Al, Au, Sn or mixtures thereof and the alloy is diffusion bonded to a portion of the non-metallic portion.

5. The composite of claim 4, and further comprising a layer of an electrically conducting metal bonded to the alloy portion forming a three layer composite of a ceramic and an alloy and a conducting metal.

6. The composite of claim 5, wherein the conducting metal is an alloy including at least one of Cu, Ag, Au and Al.

7. The composite of claim 5, wherein the ceramic is an oxide which contains Cu.

8. A composite of a non-metallic portion of glass or ceramic and an alloy portion diffusion bonded thereto, said alloy portion comprised of a alkali metal of Li, Na, K or mixtures thereof and an electrically conductive metal which forms an electrically conductive alloy with the alkali metal.

9. The composite of claim 8, wherein the non-metallic portion carries the electrically conducting metal which forms an alloy with the alkali metal.

10. The composite of claim 9, wherein an electrically conducting metal is bonded to said alloy.

11. The composite of claim 9, wherein said composite is a thin sheet.

12. The composite of claim 9, wherein said composite is a wire.

* * * * *